United States Patent
Wu et al.

(10) Patent No.: US 9,350,122 B2
(45) Date of Patent: May 24, 2016

(54) ELECTRICAL CONNECTOR HAVING SURFACE MOUNT TRANSFORMERS

(71) Applicant: HON HAI PRECISION INDUSTRY CO., LTD., New Taipei (TW)

(72) Inventors: Li-Chun Wu, New Taipei (TW); Chao-Tung Huang, New Taipei (TW); Chih-Ching Hsu, New Taipei (TW); Jie Zhang, Kunshan (CN); Bing Wang, Kunshan (CN); Jun-Hua Hu, Kun Shan (CN)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 77 days.

(21) Appl. No.: 14/277,286

(22) Filed: May 14, 2014

(65) Prior Publication Data

US 2014/0342608 A1    Nov. 20, 2014

(30) Foreign Application Priority Data

May 20, 2013  (CN) .......................... 2013 1 01878184

(51) Int. Cl.
*H01R 24/00* (2011.01)
*H01R 13/66* (2006.01)
*H01R 12/72* (2011.01)
*H01R 13/717* (2006.01)
(Continued)

(52) U.S. Cl.
CPC .......... *H01R 13/6658* (2013.01); *H01R 12/722* (2013.01); *H01R 13/6633* (2013.01); *H01R 13/7175* (2013.01); *H01R 24/64* (2013.01); *H05K 1/111* (2013.01); *H05K 2201/1003* (2013.01); *H05K 2201/10295* (2013.01)

(58) Field of Classification Search
CPC ............. H01R 23/025; H01R 13/6594; H01R 13/65802
USPC .................. 439/676, 620.11, 620.12, 620.16, 439/620.17, 620.22, 620.23, 620.26, 439/260.35, 620.38
See application file for complete search history.

(56) References Cited

U.S. PATENT DOCUMENTS

| | | | | |
|---|---|---|---|---|
| 6,102,741 A | * | 8/2000 | Boutros | ............. H01R 13/6633 336/107 |
| 6,773,298 B2 | | 8/2004 | Gutierrez et al. | |
| 6,918,790 B2 | * | 7/2005 | Wan | .................... H01R 13/6608 439/620.21 |

(Continued)

FOREIGN PATENT DOCUMENTS

| | | |
|---|---|---|
| CN | 201327913 Y | 10/2009 |
| CN | 201639097 U | 11/2010 |

(Continued)

*Primary Examiner* — Hae Moon Hyeon
(74) *Attorney, Agent, or Firm* — Ming Chieh Chang; Wei Te Chung

(57) ABSTRACT

An electrical connector includes an insulative housing, a contact module, and a magnetic module. The insulative housing defines a receiving cavity forwardly communicating with an exterior plug and a mounting cavity located behind the receiving cavity. The contact module includes a set of mating contacts each having a contacting portion exposed within the receiving cavity and a set of mounting contacts for connecting to an exterior substrate. The magnetic module is received in the mounting cavity and electrically connecting the mating contacts to corresponding mounting contacts. The magnetic module includes a printed circuit board (PCB) and four isolated transformers surface mounted on a same face thereof. The four discrete transformers are arranged on a limited space of the PCB.

20 Claims, 6 Drawing Sheets

(51) Int. Cl.
*H01R 24/64* (2011.01)
*H05K 1/11* (2006.01)

(56) References Cited

U.S. PATENT DOCUMENTS

| | | | | |
|---|---|---|---|---|
| 7,121,898 B2* | 10/2006 | Murr | H01R 24/64 | 439/676 |
| 7,241,181 B2* | 7/2007 | Machado | H01R 13/514 | 439/541.5 |
| 7,670,183 B2* | 3/2010 | Huang | H01R 13/6633 | 439/620.05 |
| 7,708,595 B2* | 5/2010 | Chow | H01R 13/6633 | 439/620.06 |
| 7,841,908 B2* | 11/2010 | Shen | H01R 13/46 | 439/676 |
| 8,038,476 B2* | 10/2011 | Chen | H01R 13/6658 | 439/620.11 |
| 8,093,980 B2 | 1/2012 | Asou et al. | | |
| 8,162,695 B2* | 4/2012 | Zhang | H01R 13/65802 | 439/620.15 |
| 8,475,213 B2* | 7/2013 | Wang | H01R 13/6585 | 439/620.05 |
| 2012/0322309 A1 | 12/2012 | Xu et al. | | |

FOREIGN PATENT DOCUMENTS

| | | |
|---|---|---|
| CN | 201766250 U | 3/2011 |
| TW | M437561 | 4/2010 |

* cited by examiner

ELECTRICAL CONNECTOR HAVING SURFACE MOUNT TRANSFORMERS

BACKGROUND OF THE INVENTION

1. Field of the Invention

The present invention relates to an electrical connector having four surface mount transformers mounted on a printed circuit board (PCB), especially relating to arrangement of the transformers for saving space.

2. Description of Related Art

U.S. Pat. No. 8,093,980, issued to Asou et al. on Jan. 10, 2012, discloses a surface mount pulse transformer for being used for an electrical connector.

Taiwan Patent No. M437561U1 issued on Sep. 11, 2012 discloses an electrical connector having a printed circuit board (PCB) mounted with two surface mount transformers and two common mode chokes thereon. The PCB used in this electrical connector has a large area where the transformers and the common mode chokes can be mounted. There is a trend of miniaturization in connector size and it is always a difficulty to reconcile between small size and good electrical performance.

An electrical connector having differently arranged surface mount transformers on an internal PCB is desired.

SUMMARY OF THE INVENTION

Accordingly, an object of the present invention is to provide an electrical connector comprising an insulative housing, a contact module, and a magnetic module. The insulative housing defines a receiving cavity forwardly communicating with an exterior plug and a mounting cavity located behind the receiving cavity. The contact module includes a set of mating contacts each having a contacting portion exposed within the receiving cavity and a set of mounting contacts for connecting to an exterior substrate. The magnetic module is received in the mounting cavity and electrically connecting the mating contacts to corresponding mounting contacts. The magnetic module includes a printed circuit board (PCB) and four isolated transformers surface mounted on a same face of the PCB. The PCB includes a front portion connecting with the mating contacts, a rear portion connecting with the mounting contacts, a first side edge and a second side edge located between the front and back portions. The transformers include a first transformer disposed adjacent to the first side edge, a fourth transformer disposed adjacent to the second side edge, a second transformer and a third transformer. The first transformer is aligned with the fourth transformer in a transverse direction. The second transformer has a section located in front of the first transformer and another section overlapped with the first transformer along the transverse direction. The third transformer has a section located behind the first transformer and another section overlapped with the first transformer along the transverse direction.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1-6, an electrical connector 100 according to the present invention is used to mount on an exterior substrate 200.

Figure 1:
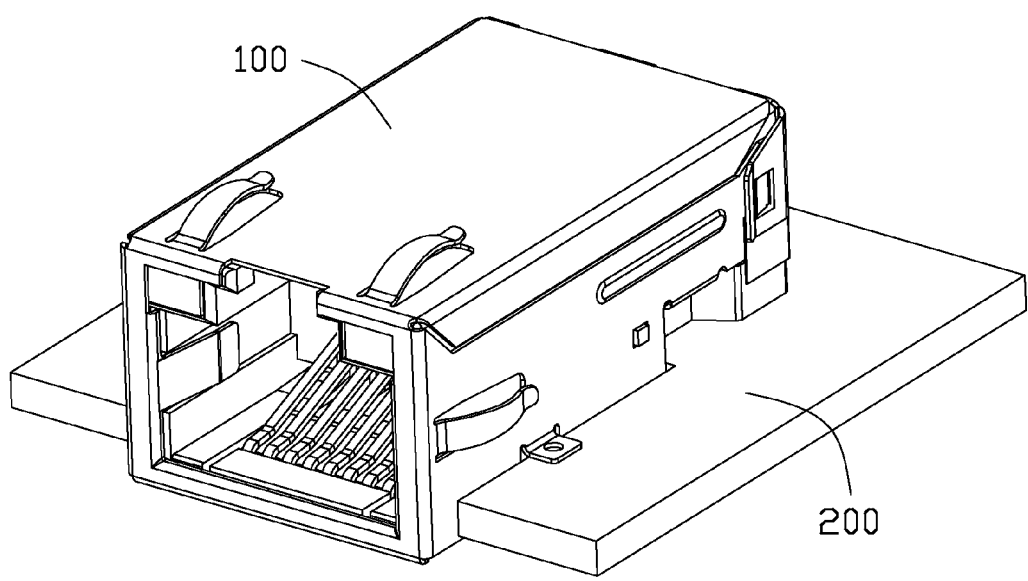
FIG. 1 is a perspective view of an electrical connector according to the invention mounted on an external substrate.
Figure 2:
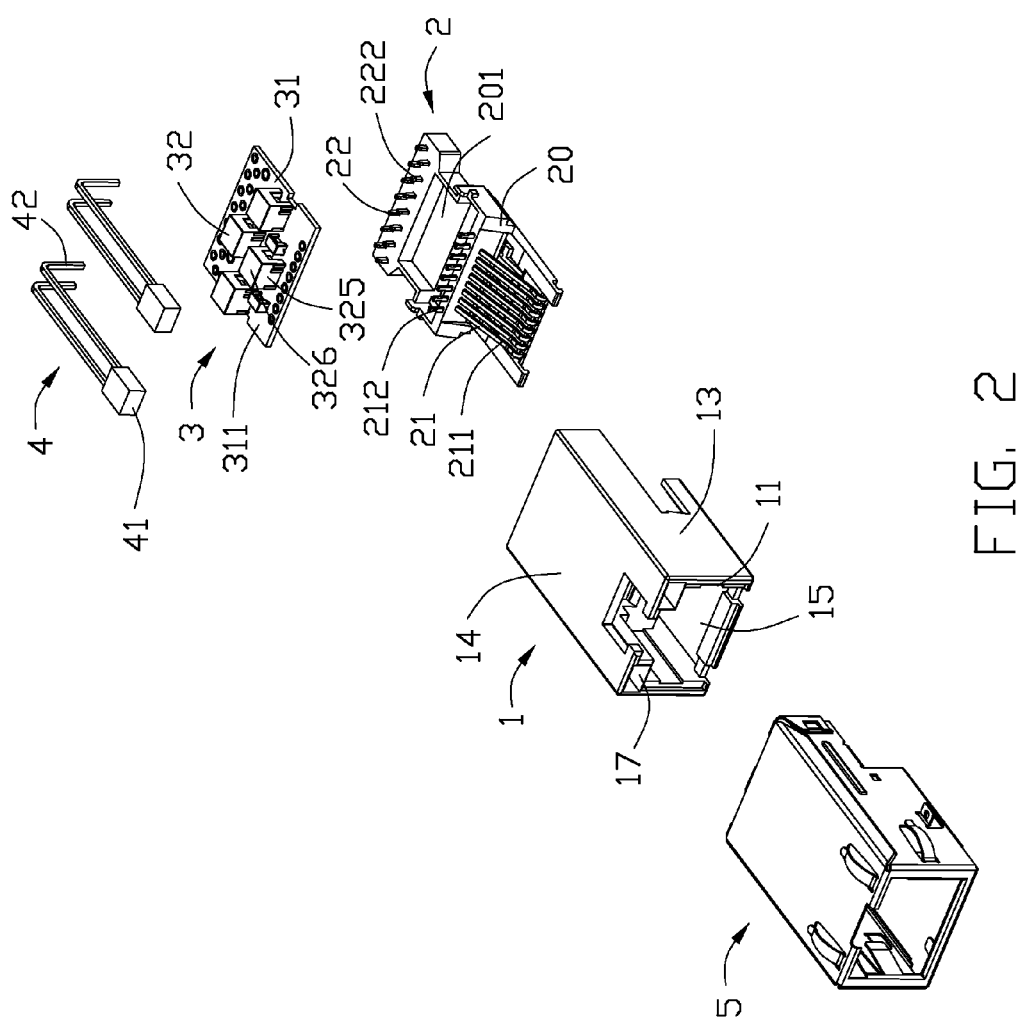
FIG. 2 is an exploded view of the electrical connector shown in FIG. 1.
Figure 3:
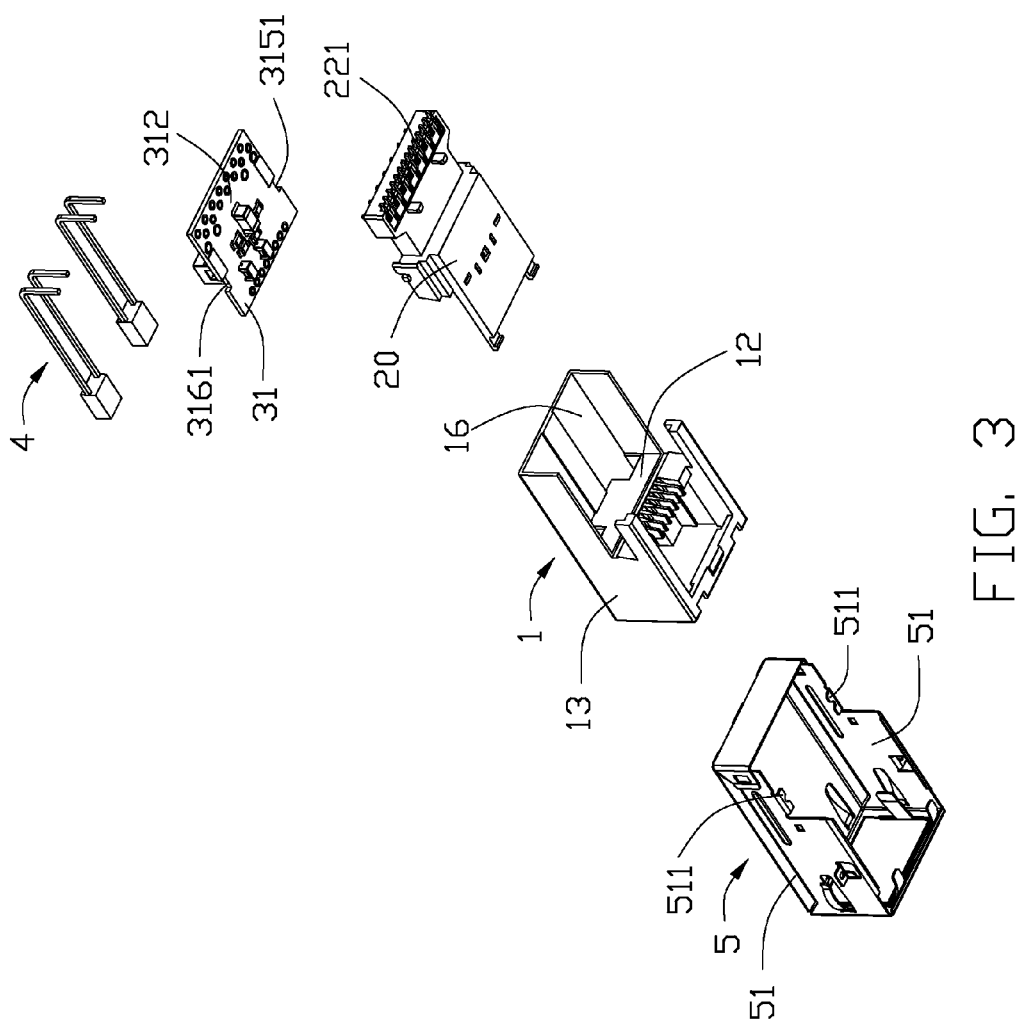
FIG. 3 is another exploded view of the electrical connector shown in FIG. 2.
Figure 4A:
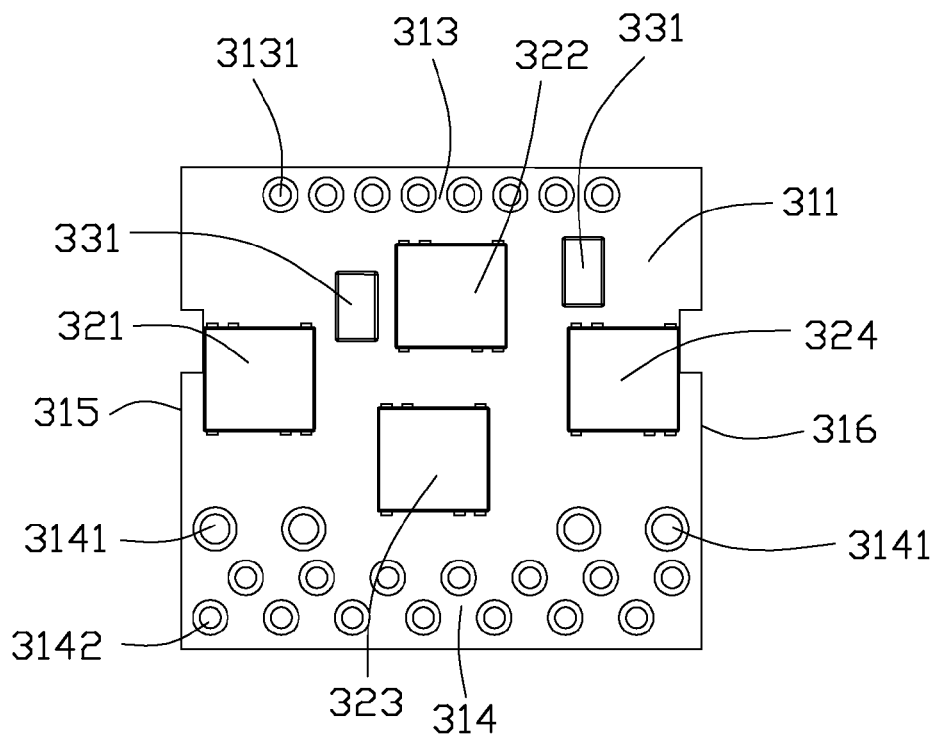
FIG. 4(A) is a top view of a magnetic module shown in FIG. 2.
Figure 4B:
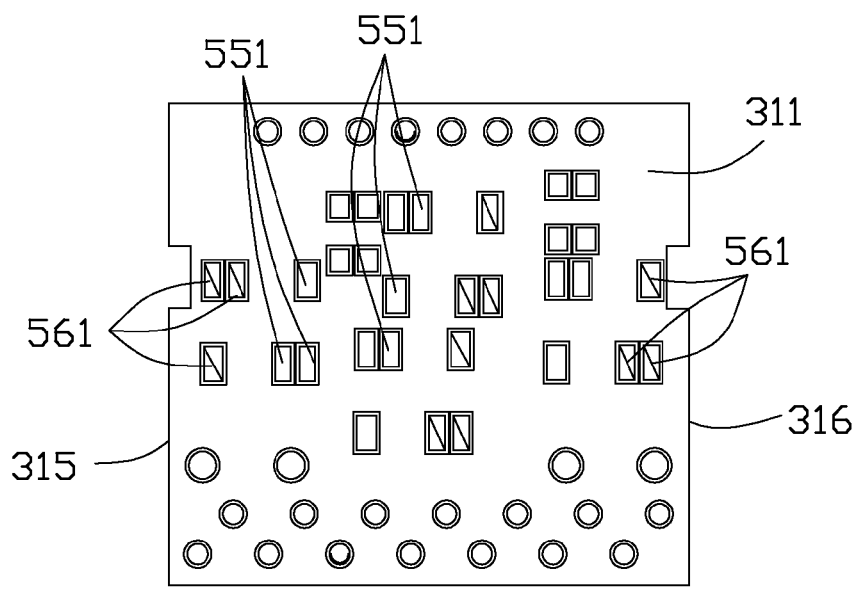
FIG. 4(B) is a schematic diagram of conductive pads of transformers connecting with conductive pads of a PCB shown in FIG. 4(A)
Figure 5A:
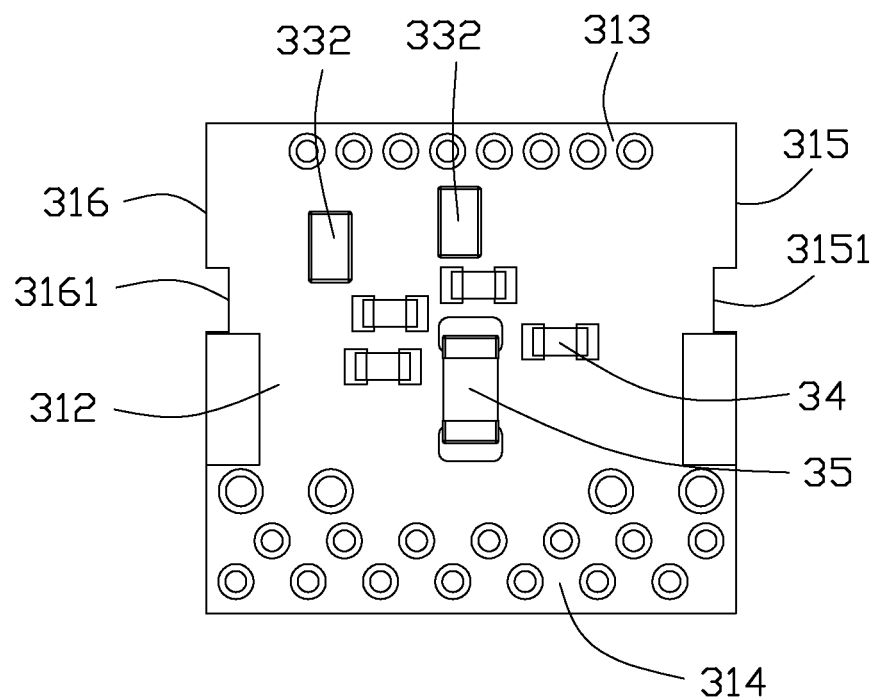
FIG. 5(A) is a bottom view of the magnetic module shown in FIG. 2.
Figure 5B:
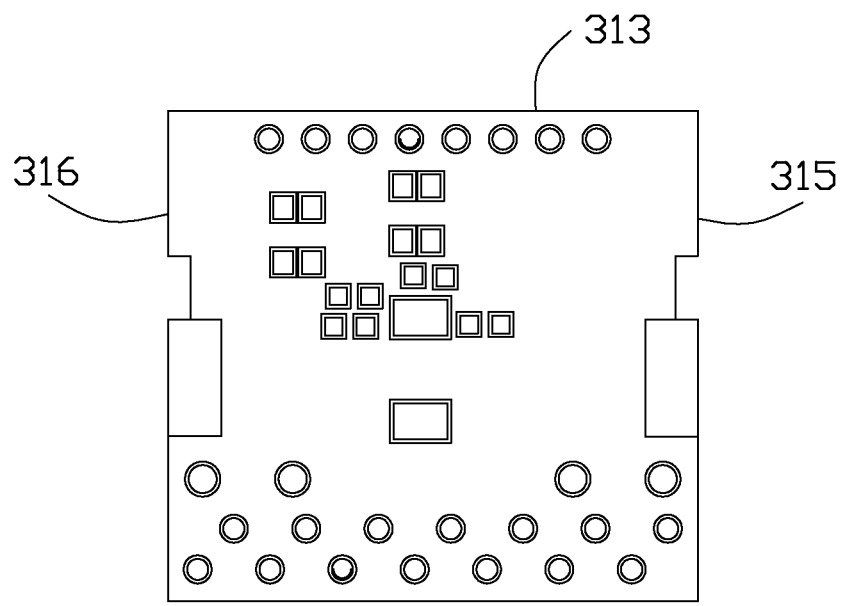
FIG. 5(B) is a schematic diagram of conductive pads of another electrical elements connecting with conductive pads of the PCB shown in FIG. 5(A)
Figure 6:
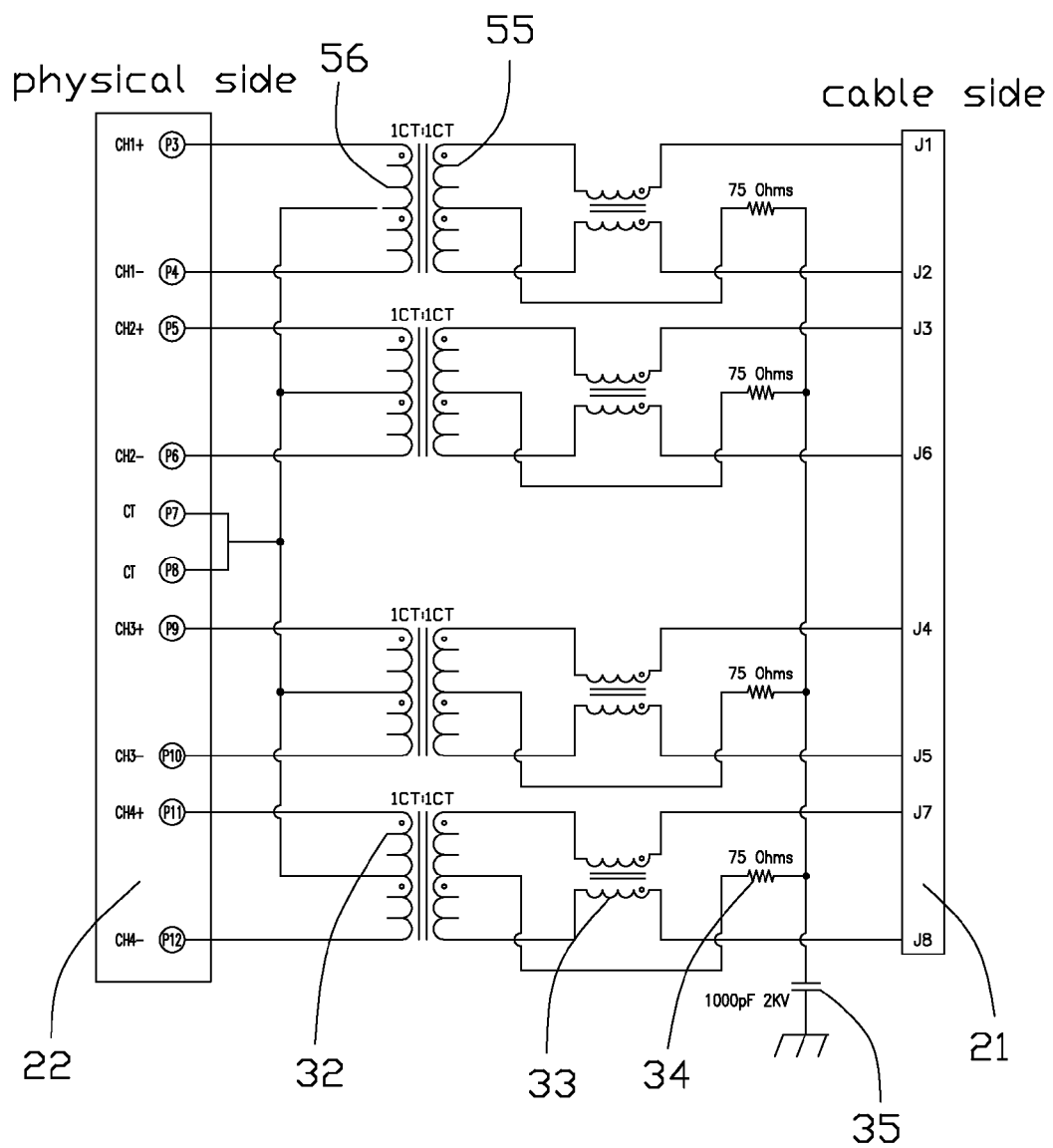
FIG. 6 is a circuit diagram of the electrical connector shown in FIG. 1.

Referring to FIGS. 2-3, the electrical connector 100 includes an insulative housing 1, a contact module 2 assembled to the insulative housing 1 along a back-to-front direction, a magnetic module 3 mounted to the contact module 2 along a top-to-bottom direction, two light emitting diodes (LEDs) 4 each having an end connecting with the contact module 2 and an opposite end mounted to the insulative housing 1, and a metallic shielding shell 5 surrounding the insulative housing 1.

The insulative housing 1 includes a front wall 11 extending vertically, a rear wall 12 extending parallel to the front wall 11, a top wall 14 extending horizontally, and two side walls 13 extending perpendicular to the front wall 11 and the top wall 14. The insulative housing 1 defines a receiving cavity 15 forwardly communicating with an exterior plug along a front-to-back direction through a front face of the insulative housing 1 and a mounting cavity 16 for the contact module 2 mounting therein. The receiving cavity 15 is divided from the mounting cavity 16 by the rear wall 12. The insulative housing 1 also defines two lateral passageways 17 for mounting the LEDs 4 respectively.

The contact module 2 includes an insulative carrier 20, a set of mating contacts 21 hold by a front section of the insulative carrier 20, and a set of mounting contacts 22 hold by the a rear section of the insulative carrier 20. The mating contacts 21 are defined as cable side, and the mounting contacts 22 are defined as physical side, as identified in FIG. 6. The mating contacts 21 are inserted molding with the insulative carrier 20. Each mating contact 21 has a contacting portion 211 exposed within the receiving cavity 15, a soldering portion 212 extending upwardly from a top section of the insulative carrier 20, and a middle portion (not labeled) buried in the insulative carrier 20. Each mounting contact 22 has a lower portion 221 for surface mounted to the exterior substrate 200, an upper portion 222 for connecting with the magnetic module 3, and a middle portion (not labeled) retention of the insulative carrier 20. The insulative carrier 20 defines a receiving slot 201 recessed downwardly along the top-to-bottom direction.

Referring to FIGS. 2-5(B), the magnetic module 3 includes a PCB 31 and four isolated transformers 32 and four common mode chokes 33 mounted thereon. The PCB 31 has a front section 313, a rear section 314, a first side edge 315 and a second side edge 316 located therebetween. The transformers 32 include a first transformer 321 disposed adjacent to the first edge 315, a fourth transformer 324 disposed adjacent to the second edge 316, a second transformer 322 and a third transformer 323 disposed between the first transformer 321 and the fourth transformer 324. Each of the second transformer 322 and the third transformer 323 at least has a section overlapped with the first transformer 321 and the fourth transformer 324 along a transverse direction perpendicular to the front-to-back direction. The second transformer 322 has a section positioned in front of the first transformer 321 and another section overlapped with the first transformer 321 along the transverse direction. The third transformer 323 has a section positioned behind the fourth transformer 324 and another section overlapped with the fourth transformer 324 along the transverse direction. The second transformer 322 and the third transformer 323 at least have an overlapped section along the front-to-back direction. If arranging the four transformers in a row at the transverse direction, the width of the PCB 31 are too long to mount to the mounting cavity 16. If arranging the four transformers in two rows at the transverse direction, the length of the PCB 31 are too long to mount to the mounting cavity 16. In the present invention, the PCB 31 could be made smallest by the shown arrangement of the transformers 32.

The PCB 31 has a top face 311 mounted with four isolated transformers 32 and a lower face 312 facing to the receiving slot 201. As a depth limitation of the receiving slot 201, the isolated transformers 32 could not be mounted on the lower face 312 of the PCB 31. As four isolated transformers 32 are disposed on the top face 311, thus there is only a tiny room for mounting other electrical elements. If mounting four common mode chokes on the lower face 312, the PCB 31 would not expect to have a plurality of conductive through holes for electrically connecting the transformers 32 to corresponding common mode chokes. The common mode chokes 33 include two common mode chokes 331 mounted on the top face 311 and other two common mode chokes 332 mounted on the lower face 312 so that full using room and decreasing numbers of conductive through holes. The common mode chokes are disposed along the front-to-back direction so that shortening conductive traces connecting between the common mode chokes and the transformers 32. The magnetic module 3 also includes four resistors 34 and a capacitor 35 mounted on the lower face 312 and received in the receiving slot 201 of the insulative carrier 20.

Referring to FIGS. 4(A)-5(B), The front section 313 defines a row of front conductive holes 3131 connecting with soldering portions 212 of the mating contacts 21. The rear section 314 defines a row of rear conductive holes 3142 connecting with the upper portion 222 of the mounting contacts 22. Each LED 4 includes a light emitting portion 41 and two terminal portions 42 extending backwardly therefrom (shown in FIG. 2). The terminal portions 42 of LED 4 are electrically connected to corresponding mounting contacts 22. The rear section 314 defines two pairs of middle conductive holes 3141 for connecting with the terminal portions 42. A pair of middle conductive holes 3141 are disposed between the first transformer 321 and the rear conductive holes 3142. Another pair of middle conductive holes 3141 are disposed between the fourth transformer 323 and the rear conductive holes 3142. The middle conductive holes 3141 are disposed behind the third transformer 323 so that the conductive traces electrically linking the terminal portions 42 and the mounting contacts 22 are short. The first edge 315 defines a first conductive recess 3151 for physically and electrically connecting with a tab 511 (shown in FIG. 3) protruding inwardly from a side wall 51 of the shielding shell 5. The second edge 316 defines a second conductive recess 3161 for physically and electrically connecting with another tab 511 protruding inwardly from the other side wall 51 of the shielding shell 5.

Referring to FIGS. 2 and 4(A)-6, each transformer 32 has a primary coil 55 electrically connects with corresponding mating contact 21, a secondary coil 56 electrically connects with corresponding mounting contact 22, a drum core 325 (shown in FIG. 2) for the primary and secondary coils 55, 56 winding around, and a plate core 326 attached to the drum core 325. The drum core 325 has a plurality of primary pads 551 connected with corresponding ends of the primary coil 55 and a plurality of secondary pads 561 connected with corresponding ends of the secondary coil 56. The drum core 325 is disposed along the front-to-back direction. The primary pads 551 and the secondary pads 561 are disposed along the transverse direction. The primary pads 551 are mounted to primary conductive pads and the secondary pads 561 are mounted to secondary conductive pads. The primary conductive pads and the secondary conductive pads are formed on the top face 311 of the PCB 31 and are opposite to each other in the transverse direction.

The secondary pads 561 of the first transformer 321 are disposed near to the first edge 315 and the secondary pads 561 of the fourth transformer 324 are disposed near to the second edge 316. The primary pads 551 of the second and third transformer 322, 323 face toward to the primary pads 551 of the first transformer 321. The receiving cavity 15 is used for mating with a modular plug (not shown) with an ethernet network wire exposed outdoors. The mating contacts 21 connect with a high voltage end of the ethernet network wire and the mounting contacts 22 connect with the lower voltage end of the substrate. The conductive pads connect with high voltage end are marked with a tilt line with a rectangle shown in FIG. 4(B). The conductive pads connect with lower voltage end are marked only with a rectangle shown in FIG. 4(B) and FIG. 5(B). The primary coils 55 of the transformers 32 electrically connect with the high voltage end of the mating contacts 21. The secondary coils 56 of the transformers 32 electrically connect with the lower voltage end of the mating mounting contacts 22. The shielding shell 5 connects with a ground line of the lower voltage end. The secondary pads 561 of the first transformer 321 are disposed near to the first edge 315 so that lower voltage ends adjacent with each other. The secondary pads 561 of the fourth transformer 324 are disposed near to the second edge 316 so that lower voltage ends are disposed adjacent with each other. The electrical connector 100 has a good and safe electric performance by above arrangement.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the members in which the appended claims are expressed.

What is claimed is:

1. An electrical connector comprising:
    an insulative housing defining a receiving cavity forwardly communicating with an exterior plug along a front-to-back direction and a mounting cavity located behind the receiving cavity;
    a contact module including a set of mating contacts each having a contacting portion exposed within the receiving cavity and a set of mounting contacts for connecting to an exterior substrate; and a magnetic module received in the mounting cavity and electrically connecting the mating contacts to corresponding mounting contacts, the magnetic module including a printed circuit board (PCB) and four isolated transformers surface mounted on a same face of the PCB, the PCB including a front portion connecting with the mating contacts, a rear portion connecting with the mounting contacts, a first side edge and a second side edge between the front and rear portions; wherein the transformers include a first transformer disposed adjacent to the first side edge, a second transformer disposed adjacent to the front portion, a third transformer disposed adjacent to the rear portion, and a fourth transformer disposed adjacent to the second side edge, the first transformer aligned with the fourth transformer along a transverse direction perpendicular to the front-to-back direction, the second transformer having a section located in front of the first transformer and another section overlapped with the first transformer along the transverse direction, the third transformer having a section located behind the first transformer and another section overlapped with the first transformer along the transverse direction.

2. The electrical connector as claimed in claim 1, wherein said second transformer has a section overlapped with the third transformer along the front-to-back direction.

3. The electrical connector as claimed in claim 1, wherein each transformer has a drum core disposed along the front-to-back direction, a plurality of coils winding around the drum core to form a primary coil and a secondary coil, and a plurality of conductive pads for connecting with corresponding conductive pads of the printed circuit board.

4. The electrical connector as claimed in claim 1, further including two light emitting diodes each having a light emitting portion mounted to the insulative housing and two terminal portions extending backwardly, and wherein a rear section of the PCB has two pairs of middle conductive holes for insertion of the terminal portions, respectively.

5. The electrical connector as claimed in claim 4, wherein one pair of middle conductive holes are disposed adjacent to the first side edge and the other pair of middle conductive holes are disposed adjacent to the second side edge.

6. The electrical connector as claimed in claim 5, wherein said PCB defines a row of front holes for connecting with the mating contacts and a plurality of rear holes for connecting with the mounting contacts, a first pair of the middle holes located between the first transformer and the rear holes, a second pair of the other middle holes located between the fourth transformer and the rear holes.

7. The electrical connector as claimed in claim 6, wherein said first and second pairs of middle holes are disposed behind the fourth third transformer along the front-to-back direction.

8. The electrical connector as claimed in claim 1, further including four common mode chokes surface mounted on the printed circuit board, and wherein the printed circuit board includes a first surface mounted with the transformers and two of the four common mode chokes and a second surface mounted with the other two common mode chokes.

9. The electrical connector as claimed in claim 8, wherein each of the two common mode chokes is disposed adjacent to the front portion of the printed circuit board along the front-to-back direction.

10. The electrical connector as claimed in claim 8, wherein said contact module includes an insulative carrier having a front section holding the mating contacts, a rear section holding the mounting contacts, and a receiving slot positioned between the front and rear sections, and said other two common mode chokes are received in the receiving slot.

11. An electrical connector comprising:
an insulative housing defining a receiving cavity and a mounting cavity behind the receiving cavity in a front-to-back direction;
a printed circuit board (PCB) located in the mounting cavity and defining opposite front and rear edge regions along the front-to-back direction, opposite first and second surfaces in a vertical direction perpendicular to said front-to-back direction, and opposite first and second lateral sides in a transverse direction perpendicular to both said front-to-back direction and said vertical direction;
a plurality of mating contacts disposed in the housing with front contacting sections exposed in the receiving cavity and soldering portions mounted to said front edge region of the PCB;
a plurality of mounting contacts connected to the rear edge region;
four transformers including first, second, third and fourth transformers commonly surface-mounted upon the first surface, each of said four transformers having a center; wherein
the first transformer is disposed adjacent to the first lateral side, the second transformer is disposed adjacent to the front edge region, the third transformer is disposed adjacent to the rear edge region, and the fourth transformer is disposed adjacent to the second lateral side, the first transformer aligned with the fourth transformer along the transverse direction, the second transformer having a section located in front of the first transformer, the third transformer having a section located behind the first transformer.

12. The electrical connector as claimed in claim 11, further including four common mode chokes, wherein at least one of said four common mode chokes is located upon the second surface and the remainders are mounted upon the first surface.

13. The electrical connector as claimed in claim 12, wherein two of four common mode chokes are located upon the second surface and the other two of said four common mode chokes are located upon the first surface.

14. The electrical connector as claimed in claim 11, wherein each of said four transformers has a primary coil with ends mounted to primary conductive pads, and a secondary coil with ends mounted to secondary conductive pads, said primary conductive pads and said secondary conductive pads being formed on the first face of the PCB and being opposite to each other in the transverse direction.

15. The electrical connector as claimed in claim 11, wherein the PCB forms two opposite conductive recesses at the two opposite lateral sides, and two of said four transformers are intimately located adjacent to said two opposite conductive recesses, respectively.

16. The electrical connector as claimed in claim 11, wherein said second transformer is located closer to a front edge of the PCB than said third transformer is to a rear edge of the PCB.

17. The electrical connector as claimed in claim 11, further including a capacitor mounted upon the second surface, wherein said capacitor has two opposite electrodes spaced from each other in the front-to-back direction.

18. The electrical connector as claimed in claim 11, further including a pair of LEDs (Light Emitting Diodes) retained in the housing, wherein each of said LEDs includes two terminals mounted to the rear edge region.

19. The electrical connector as claimed in claim 11, further including a plurality of resistors mounted upon the second surface, each resistor having two opposite ends spaced from each other in the transverse direction.

20. An electrical connector comprising:
- an insulative housing defining a receiving cavity and a mounting cavity behind the receiving cavity in a front-to-back direction;
- a printed circuit board (PCB) located in the mounting cavity and defining opposite front and rear edge regions along the front-to-back direction and opposite first and second surfaces thereof in a vertical direction perpendicular to said front-to-back direction;
- a plurality of mating contacts disposed in the housing with front contacting sections exposed in the receiving cavity and soldering portions mounted to said front edge region of the PCB;
- a plurality of mounting contacts connected to the rear edge region; and
- four transformers including first, second, third and fourth transformers commonly surface-mounted upon the first surface and four common mode chokes including two mounted upon the first surface and other two mounted upon the second surface; wherein
- an area defined by a boundary of said four transformers is located closer to a front edge of the PCB than to a rear edge of the PCB.

\* \* \* \* \*